US012593407B2

(12) United States Patent　　(10) Patent No.:　US 12,593,407 B2

Fukuchi　　(45) Date of Patent:　Mar. 31, 2026

(54) ELECTRONIC DEVICE

(71) Applicant: Kioxia Corporation, Tokyo (JP)

(72) Inventor: Satoru Fukuchi, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 883 days.

(21) Appl. No.: 17/842,709

(22) Filed: Jun. 16, 2022

(65) Prior Publication Data

US 2023/0309233 A1　　Sep. 28, 2023

(30) Foreign Application Priority Data

Mar. 23, 2022　(JP) .................................. 2022-046759

(51) Int. Cl.
| | |
|---|---|
| *H01L 25/16* | (2023.01) |
| *H01L 23/498* | (2006.01) |
| *H01L 23/66* | (2006.01) |
| *H05K 1/11* | (2006.01) |
| *H05K 1/181* | (2026.01) |

(52) U.S. Cl.
CPC ....... *H05K 1/181* (2013.01); *H01L 23/49827* (2013.01); *H01L 23/49838* (2013.01); *H01L 25/16* (2013.01); *H01L 25/162* (2013.01); *H05K 1/113* (2013.01); *H05K 2201/09481* (2013.01); *H05K 2201/09518* (2013.01); *H05K 2201/10174* (2013.01); *H05K 2201/10378* (2013.01); *H05K 2201/10515* (2013.01); *H05K 2201/1053* (2013.01); *H05K 2201/10734* (2013.01)

(58) Field of Classification Search
CPC ................... H05K 1/181; H05K 1/113; H05K 2201/09481; H05K 2201/09518; H05K 2201/10174; H05K 2201/10378; H05K 2201/10515; H05K 2201/1053; H05K 2201/10734; H05K 1/117; H05K 1/145; H05K 1/141; H05K 3/3436; H05K 2201/10015; H05K 2201/10522; H05K 2201/10666; H05K 1/0231; H05K 1/111; H01L 23/49827; H01L 23/49838; H01L 25/16; H01L 25/162; H01L 23/49816; H01L 23/49822; H01L 23/49833; H01L 23/50; H01L 23/60; H01L 2223/6627; H01L 23/66

See application file for complete search history.

(56) References Cited

U.S. PATENT DOCUMENTS

| | | | |
|---|---|---|---|
| 7,773,389 B2 | 8/2010 | Katayama et al. | |
| 9,491,860 B2 | 11/2016 | Akahoshi | |

(Continued)

*Primary Examiner* — Teresa M. Arroyo

(74) *Attorney, Agent, or Firm* — Foley & Lardner LLP

(57)　　　　　ABSTRACT

An electronic device according to an embodiment includes first and second substrates, first and second conductors, and an electronic component. The first substrate includes a first connector portion, first pad portions, and a first transmission line. The first pad portions include a second pad portion, the first transmission line coupling the second pad portion and the first connector portion. The second substrate includes third pad portions. The third pad portions include a fourth pad portion and a fifth pad portion. The first conductor is coupled to the fourth pad portion and to the second pad portion. The second conductor is coupled to the fifth pad portion. The first electronic component has one end coupled to the first conductor and other end coupled to the second conductor.

20 Claims, 9 Drawing Sheets

(56) References Cited

U.S. PATENT DOCUMENTS

| | | | | |
|---|---|---|---|---|
| 9,699,887 | B2 | 7/2017 | Mizutani et al. | |
| 2003/0043558 | A1* | 3/2003 | Shirasaki ............. | H05K 1/0243 |
| | | | | 361/767 |
| 2005/0213281 | A1 | 9/2005 | He et al. | |
| 2011/0090662 | A1* | 4/2011 | Jang ..................... | H05K 1/0231 |
| | | | | 361/782 |
| 2014/0293566 | A1* | 10/2014 | Mizutani ............. | H05K 1/0251 |
| | | | | 174/250 |
| 2017/0005047 | A1* | 1/2017 | Kawasaki ............... | H01L 24/02 |
| 2017/0359893 | A1* | 12/2017 | Goh ....................... | H05K 1/141 |
| 2019/0206815 | A1* | 7/2019 | Laguvaram ............. | H01L 25/16 |

* cited by examiner

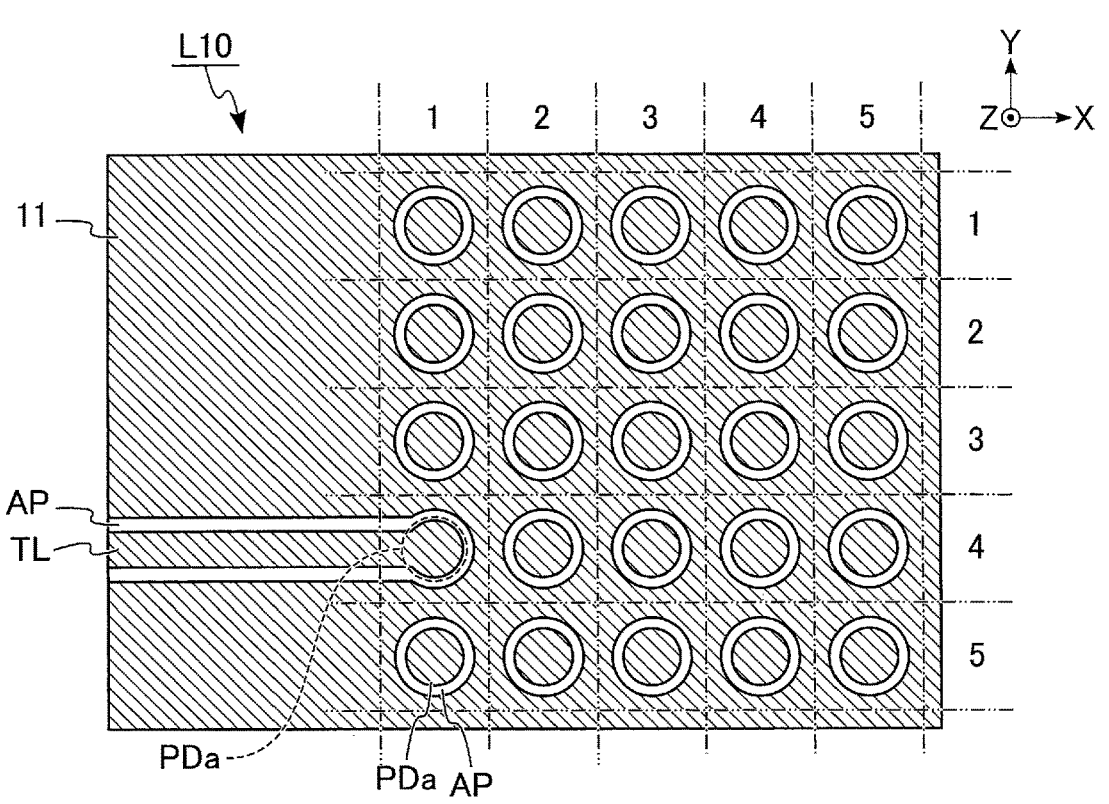
F I G. 3
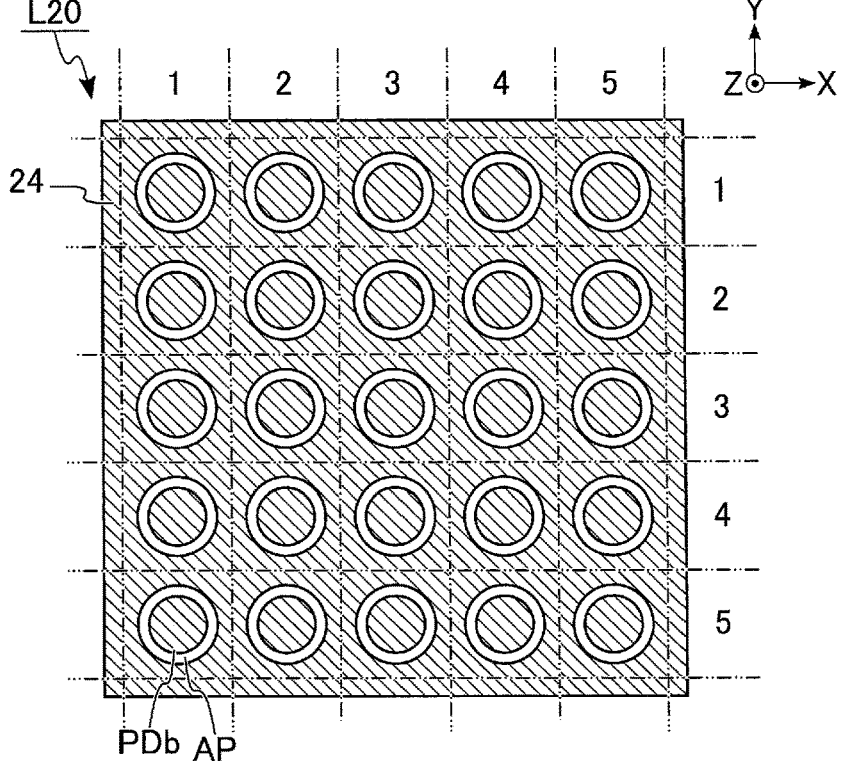
F I G. 4

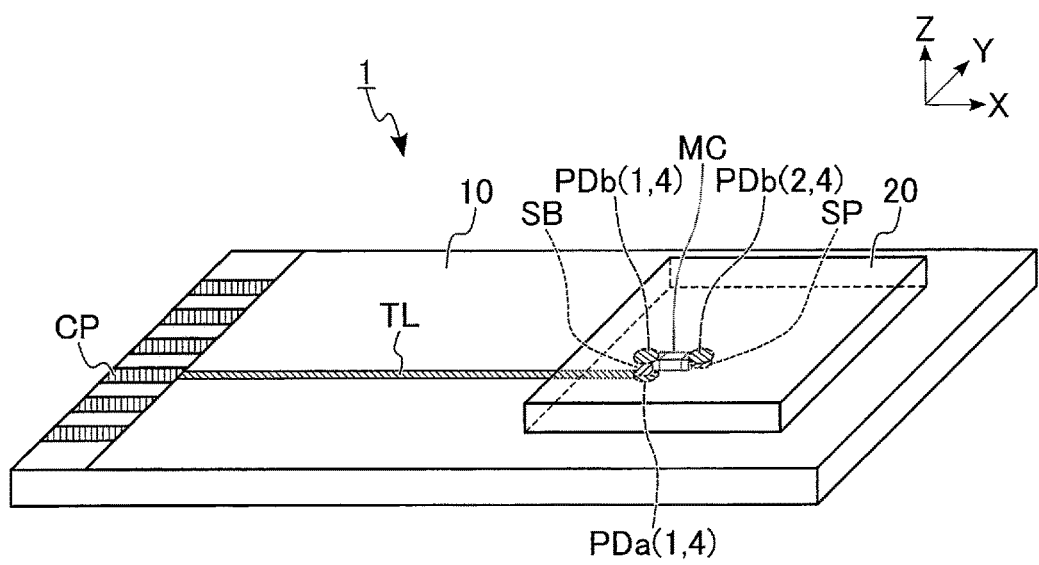
F I G. 5
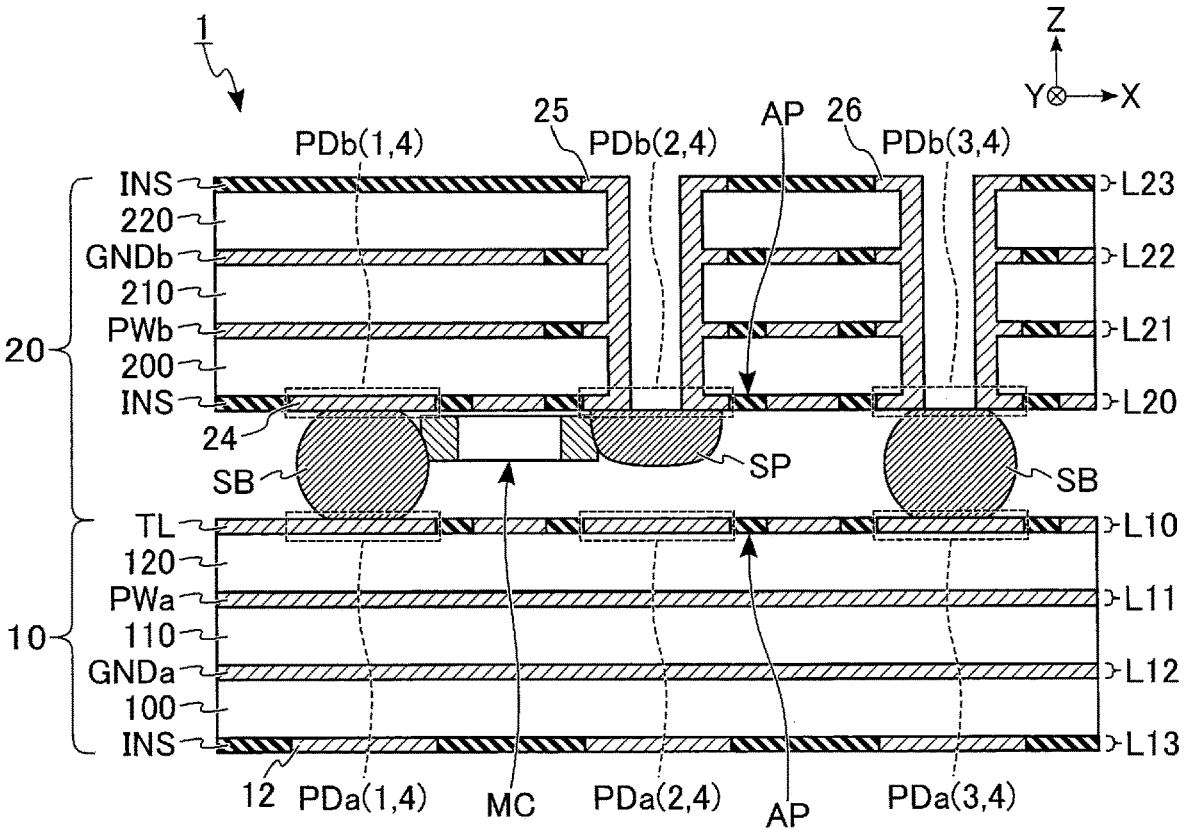
F I G. 6

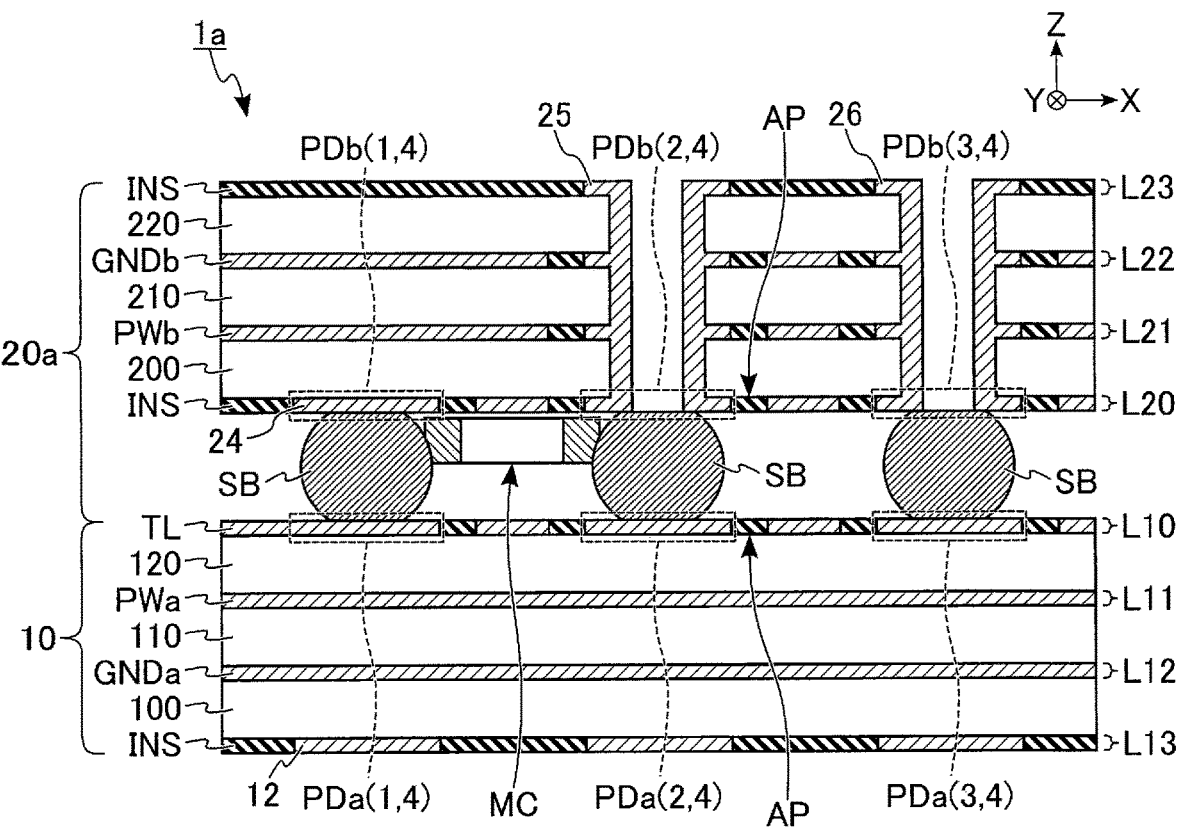
F I G . 7

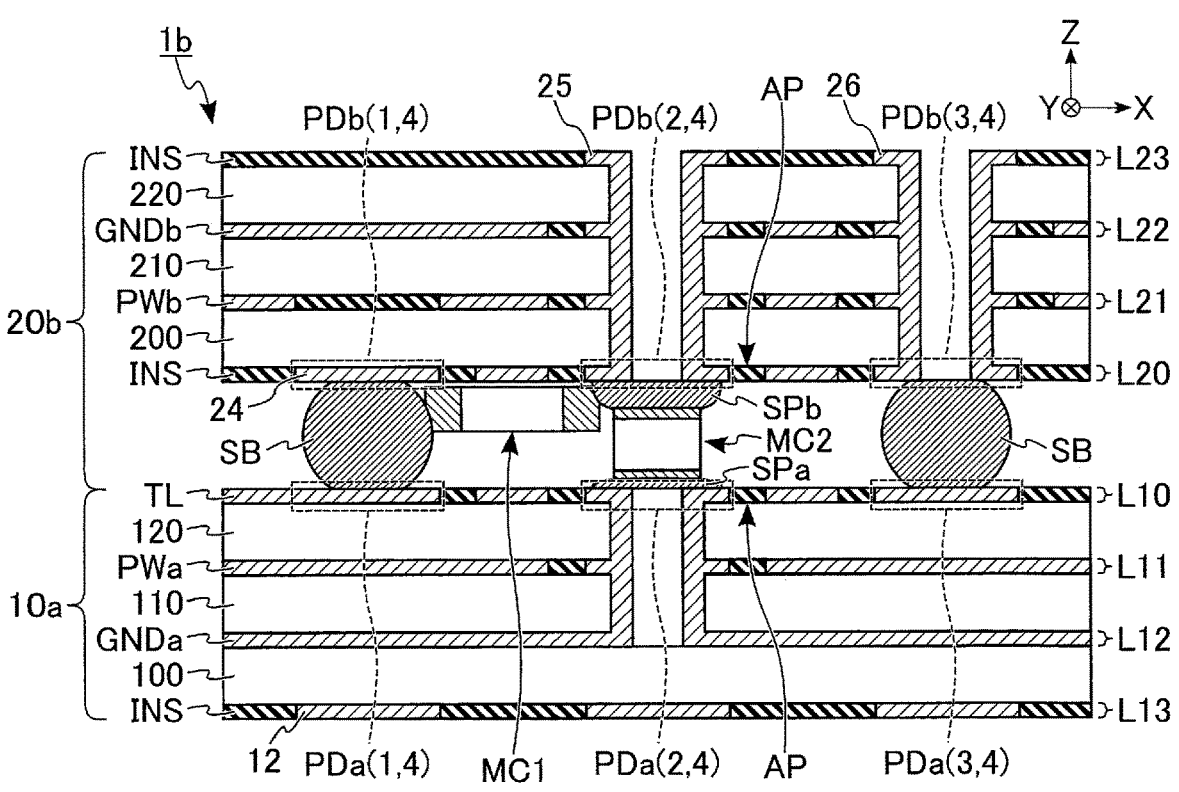
F I G. 8
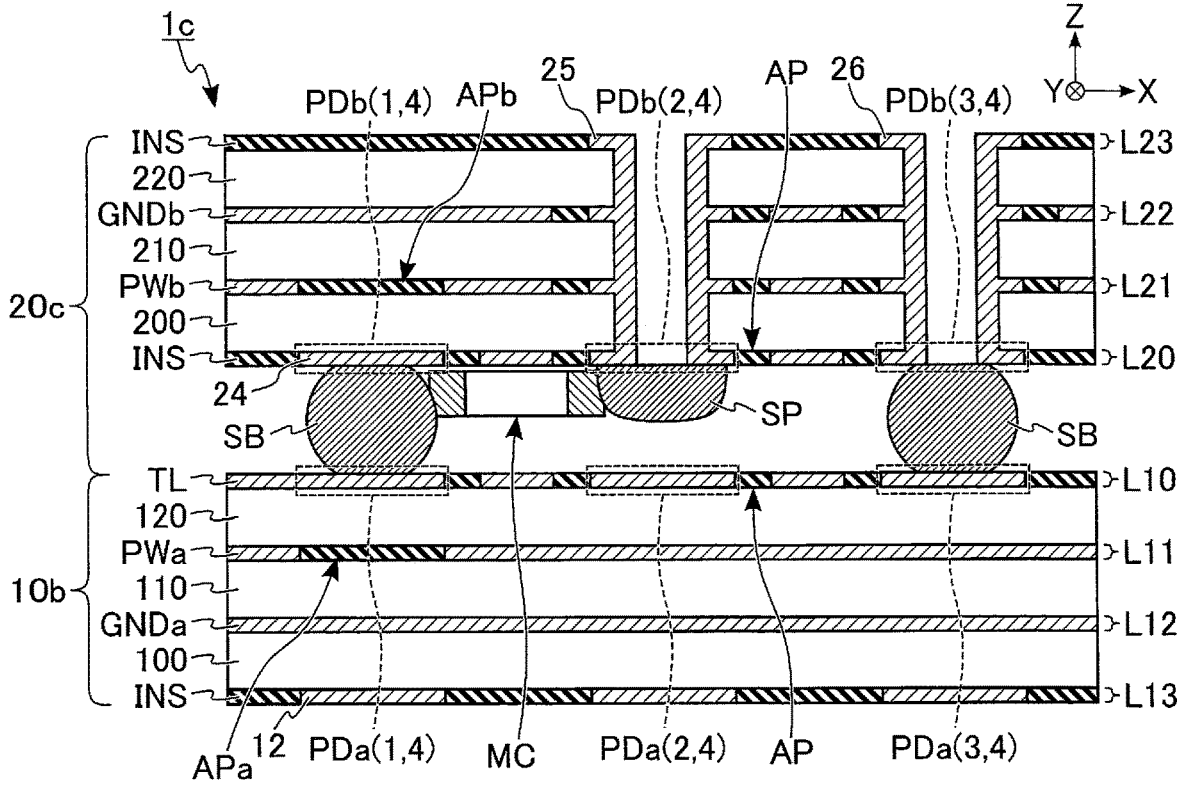
F I G. 9

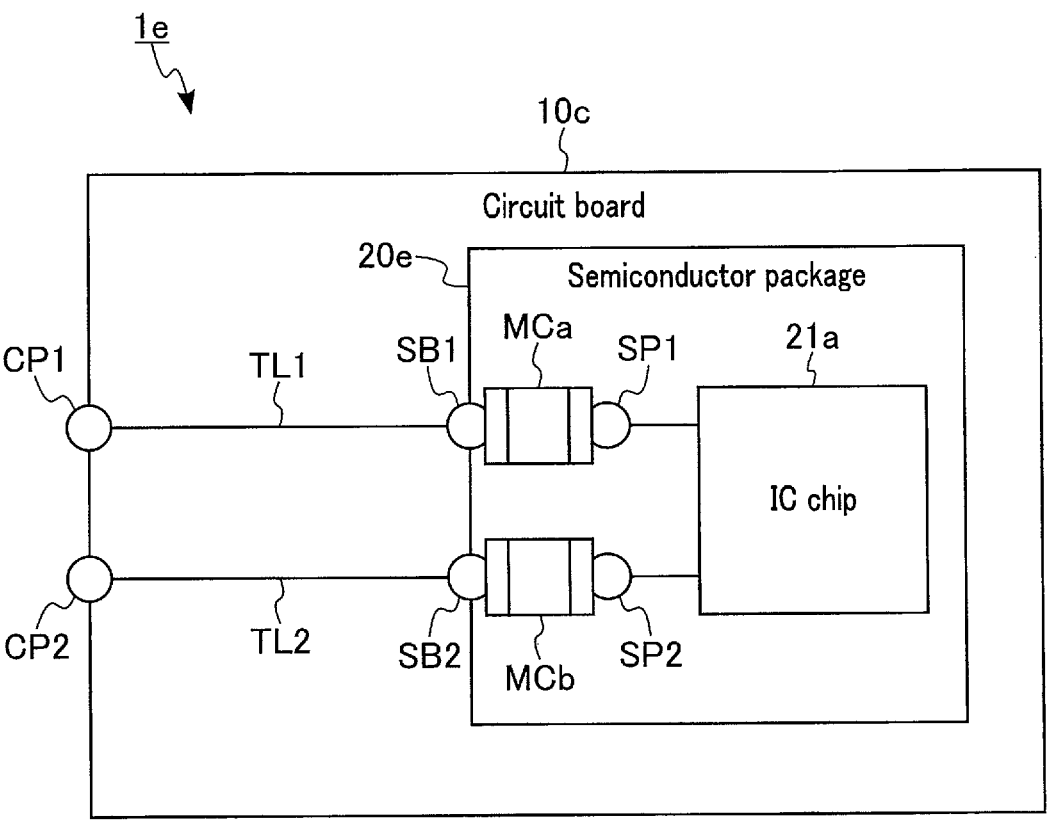
F I G. 11

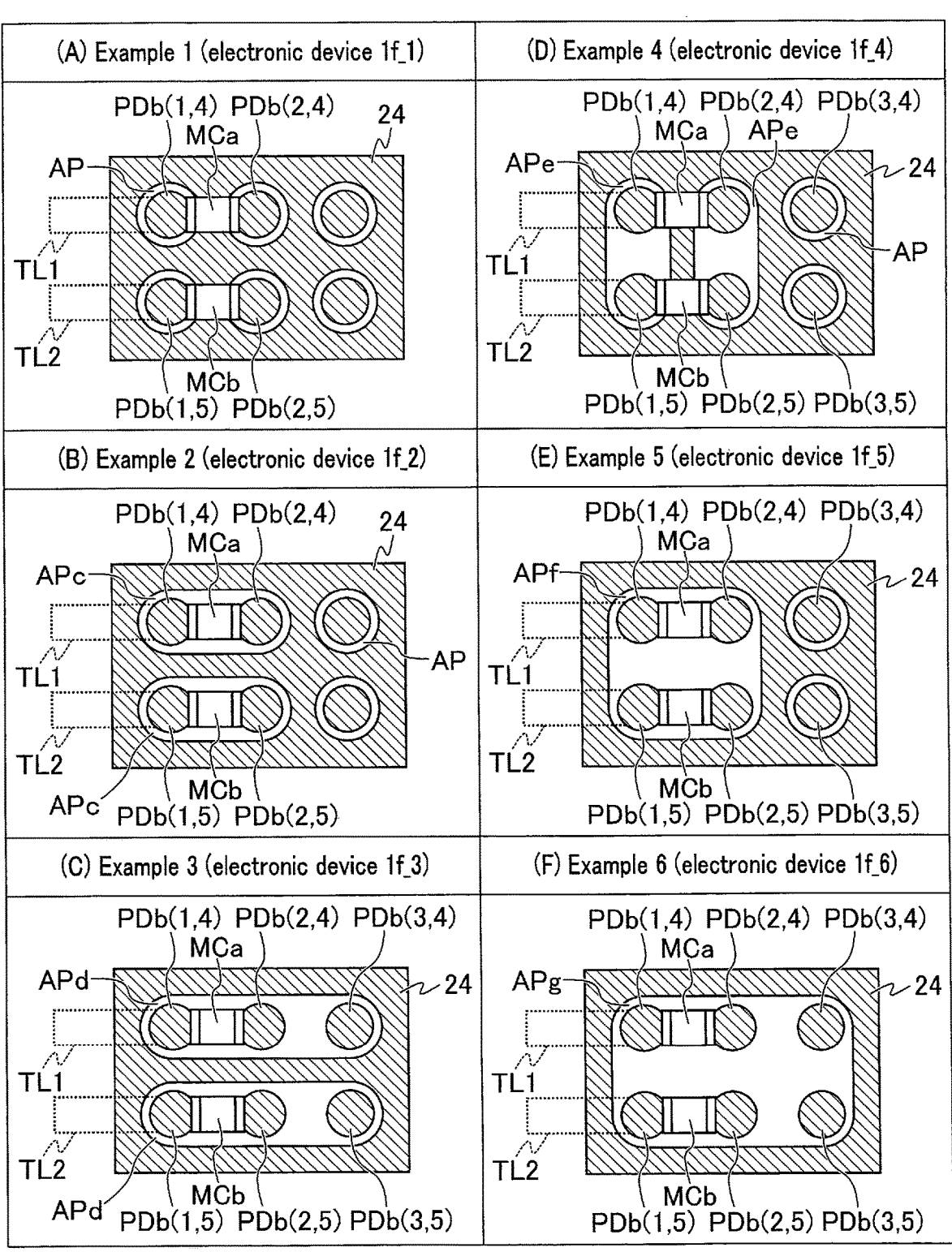
F I G. 12

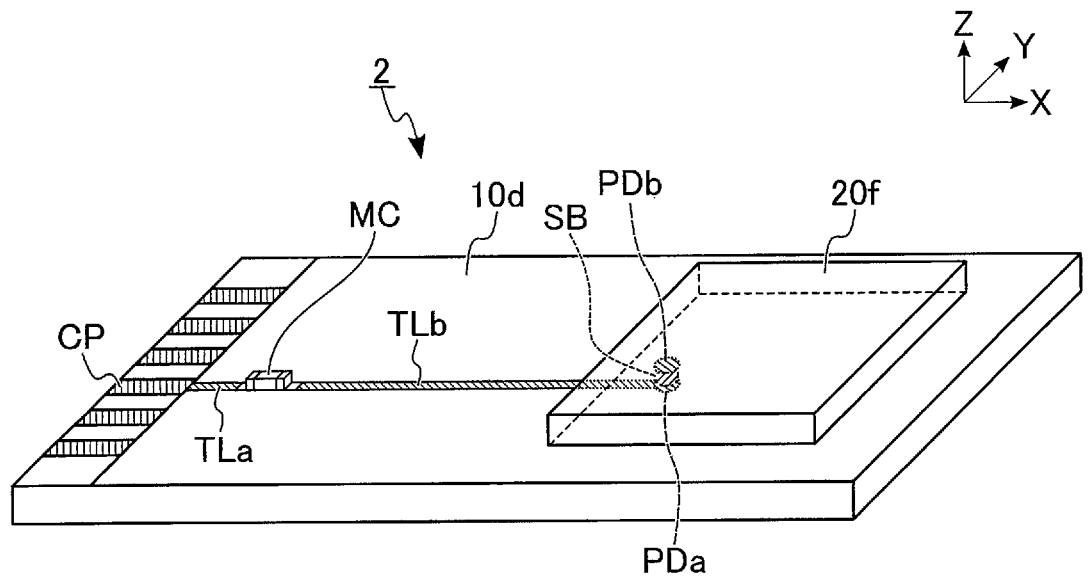
F I G. 13

ELECTRONIC DEVICE

CROSS-REFERENCE TO RELATED APPLICATIONS

This application is based upon and claims the benefit of priority from Japanese Patent Application No. 2022-046759, filed Mar. 23, 2022, the entire contents of which are incorporated herein by reference.

FIELD

Embodiments described herein relate generally to an electronic device.

BACKGROUND

A Ball Grid Array (BGA) has been known as a semiconductor package used for an electronic device.

BRIEF DESCRIPTION OF THE DRAWINGS

FIG. 3 is a plan view showing an exemplary planar layout of an interconnect layer corresponding to the upper surface of the circuit board in the electronic device according to the embodiment.

FIG. 4 is a plan view showing an exemplary planar layout of an interconnect layer corresponding to the lower surface of the substrate of the semiconductor package in the electronic device according to the embodiment.

FIG. 5 is a perspective view of an exemplary arrangement of a mounted component in the electronic device according to the embodiment.

FIG. 6 is a cross-sectional view showing a detailed cross-sectional structure of the electronic device according to the embodiment.

FIG. 7 is a cross-sectional view showing an exemplary configuration of an electronic device according to the first modification example.

FIG. 8 is a cross-sectional view showing an exemplary configuration of an electronic device according to the second modification example.

FIG. 9 is a cross-sectional view showing an exemplary configuration of an electronic device according to the third modification example.

FIG. 11 is a block diagram showing an exemplary configuration of an electronic device according to the fifth modification example.

FIG. 12 is a diagram showing exemplary configurations of electronic devices according to the sixth modification example.

FIG. 13 is a perspective view showing an exemplary arrangement of a mounted component in an electronic device according to a comparative example.

DETAILED DESCRIPTION

Figure 1:
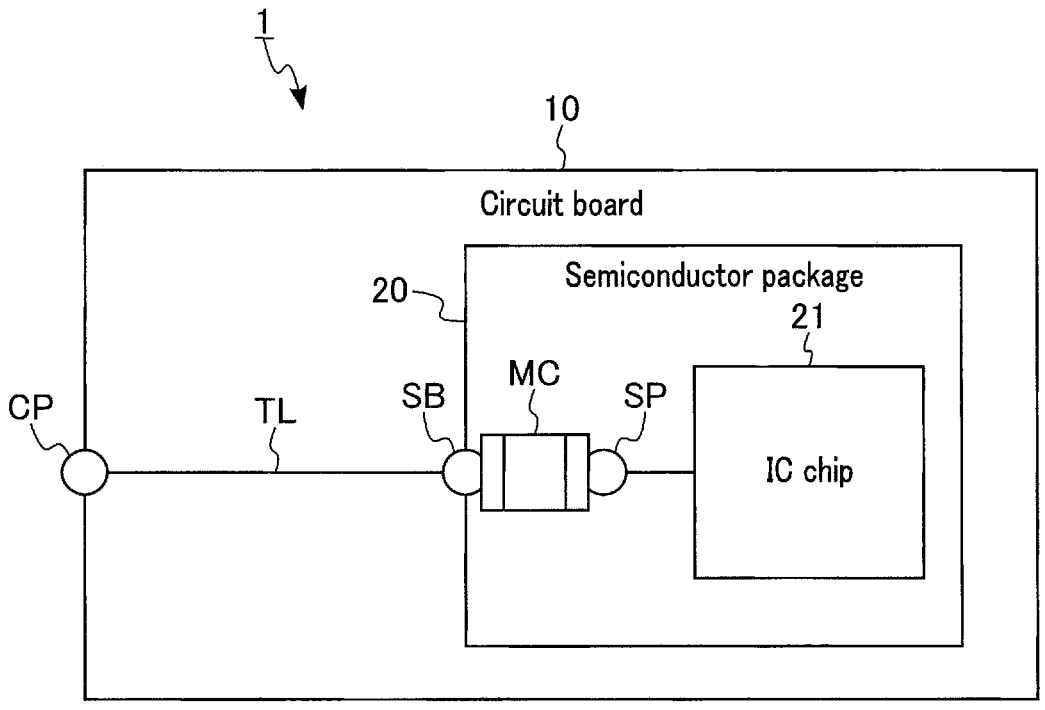
FIG. 1 is a block diagram showing an exemplary configuration of an electronic device according to the embodiment.

In general, according to one embodiment, an electronic device includes a first substrate, a second substrate, a first conductor, a second conductor, and a first electronic component. The first substrate includes a first connector portion, a plurality of first pad portions, and a first transmission line. The first pad portions are arranged at intervals in a grid pattern on an upper surface of the first substrate. The first pad portions include a second pad portion, the first transmission line coupling the second pad portion and the first connector portion to each other. The second substrate includes a plurality of third pad portions. The third pad portions are arranged on a lower surface of the second substrate to respectively oppose the first pad portions in a first direction. The third pad portions include a fourth pad portion and a fifth pad portion. The first conductor is coupled to the fourth pad portion and to the second pad portion. The second conductor is coupled to the fifth pad portion. The first electronic component has one end coupled to the first conductor and other end coupled to the second conductor.

The embodiments will be explained below by referring to the drawings. The embodiments exemplify a device and a method that realize the technical concept of the invention. The drawings are schematically or conceptually drawn, and the dimensions and proportions in the drawings may not always reflect the actual ones. Parts of the configurations may be suitably omitted. Hatch patterns on the plan views may not relate to the materials or properties of the structural components. Throughout the specification, structural components having basically the same functions and configurations are referred to by the same reference symbols.

The reference symbols may contain numerals or character strings to distinguish similar components having the same reference symbols from each other.

[1] EMBODIMENTS

An electronic device 1 according to the embodiment will be described below.

[1-1] Configuration

[1-1-1] Configuration of Electronic Device 1

FIG. 1 is a block diagram showing an exemplary configuration of the electronic device 1 according to the embodiment. The electronic device 1 may include a circuit board 10 and a semiconductor package 20.

The circuit board 10 may be a printed circuit board (PCB) composed of a single layer or multiple layers. The circuit board 10 may have at least one semiconductor package 20 mounted thereon. The circuit board 10 may include a connector portion CP and a transmission line TL. The circuit board 10 may include multiple connector portions CP, and may include multiple transmission lines TL. The joint of the semiconductor package 20 and an external device may be created by multiple pairs of connector portions CP and transmission lines TL.

The connector portion CP is an external connection terminal configured to establish an electrical connection between the semiconductor package 20 and the external device. The number of connector portions CP is determined in conformity with the communication interface standard that is adopted for communiations between the external device and the electronic device 1.

The transmission line TL is a wiring pattern, coupling the connector portion CP and semiconductor package 20 to each other. The transmission line TL may also be referred to as a "transmission path" or "interconnect".

The semiconductor package 20 is a Ball Grid Array (BGA) mounted on the circuit board 10. The semiconductor package 20 may include an IC chip 21, solder balls SB, solder portions SP, and mounted components MC. The solder balls SB and solder portions SP are arranged at predetermined intervals in a grid pattern on the bottom surface of the semiconductor package 20.

The IC chip 21 is a semiconductor device including a semiconductor integrated circuit. Various types of semiconductor devices can be used as an IC chip 21, including a semiconductor memory device such as a NAND flash memory.

A solder ball SB is an external electrode terminal. The solder ball SB forms a conductive body used for packaging of the semiconductor package 20. A solder ball SB may be referred to as a "BGA pad", or may be simply referred to as a "conductor". The semiconductor package 20 may have a plurality of solder balls SB on its bottom surface. The solder balls SB may also be used for joints of the semiconductor package 20 and a mounted component MC.

A solder portion SP is an external electrode terminal. The solder portion SP forms a conductive body used for mounting the electronic components. A solder portion SP may be referred to as a "solder paste", or may be simply referred to as a "conductor". The solder portion SP may be used for a joint of the semiconductor package 20 and mounted component MC. The semiconductor package 20 may have a plurality of solder balls SB on its bottom surface.

A mounted component MC may be a coupling capacitor. The mounted component MC is arranged and coupled between a solder ball SB and a solder portion SP. In particular, one end of the mounted component MC is in contact with the solder ball SB, while the other end of the mounted component MC is in contact with the solder portion SP. In this manner, a joint is created between the connector portion CP and the IC chip 21 via the transmission line TL, solder ball SB, mounted component MC, and solder portion SP. When a coupling capacitor is adopted as the mounted component MC, the mounted component MC may remove direct current (DC) components from signals that are carried on the transmission line TL. That is, the mounted component MC may be used for AC coupling. For the mounted component MC, other electronic components may be adopted in accordance with its mounting position, such as a diode and a resistor. The number of solder portions SP on the bottom surface of the semiconductor package 20 may correspond to the number of mounted components MC on the bottom surface of the semiconductor package 20.

[1-1-2] Configuration of Electronic Device 1

Next, the configuration of the electronic device 1 according to the embodiment will be described in detail. A three-dimensional Cartesian coordinate system is used in the drawings that are referred to below. The X direction corresponds to a direction parallel to the upper surface of the circuit board 10. The Y direction corresponds to a direction parallel to the upper surface of the circuit board 10 and orthogonal to the X direction. The Z direction corresponds to a direction perpendicular to the upper surface of the circuit board 10. Throughout this specification, the "upper surface of the circuit board 10" refers to the side of the circuit board 10 on which the semiconductor package 20 is mounted. The "up/down" direction is defined along the Z direction, with a direction from the circuit board 10 toward the semiconductor package 20 being a positive (upward) direction.

Figure 2:
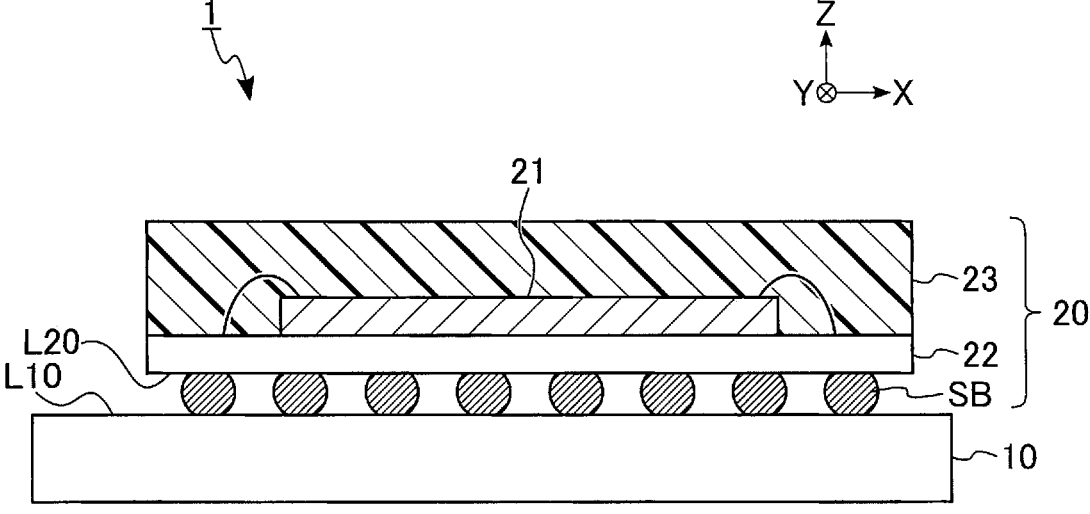
FIG. 2 is a cross-sectional overview of the configuration of a joint portion of a circuit board and a semiconductor package in the electronic device according to the embodiment.

[1. Overview of Configuration of Joint Portion] FIG. 2 is a cross-sectional overview of the configuration of a joint portion of the circuit board 10 and the semiconductor package 20 in the electronic device 1 according to the embodiment.

The circuit board 10 further includes a plurality of pad portions (not shown) in areas overlapping the semiconductor package 20 in the Z direction. The pad portions of the circuit board 10 provided in the areas overlapping the semiconductor package 20 in the Z direction are coupled to the solder balls SB, which are provided on the semiconductor package 20 opposite to the pad portions in the Z direction.

The semiconductor package 20 includes a substrate 22 and a sealing member 23. The substrate 22 may be a printed circuit board (PCB) composed of a single layer or multiple layers. A plurality of solder balls SB are arranged on the lower surface of the substrate 22. A plurality of pad portions (not shown) and an IC chip 21 are provided on the upper surface of the substrate 22. Each of the pad portions on the upper surface of the substrate 22 is coupled to the corresponding one of the solder balls on the lower surface of the substrate 22. The IC chip 21 is coupled to each of the pad portions on the upper surface of the substrate 22, for example by a plurality of bonding wires. The sealing member 23 is an insulator, sealing the IC chip 21 on the substrate 22. The sealing member 23 may be an epoxy resin.

Hereinafter, the interconnect layer corresponding to the upper surface of the single-layered or multi-layered circuit board 10 will be referred to as "L10". The interconnect layer corresponding to the lower suface of the single-layered or multi-layered substrate 22 will be referred to as "L20". The planarly shaped pad portions provided in the circuit board 10 and in the substrate 22 may be referred to as "land portions".

[2. Planar Layout of Interconnect Layer L10 of Circuit Board 10]

FIG. 3 is a plan view showing an exemplary planar layout of the interconnect layer L10 corresponding to the upper surface of the circuit board 10 in the electronic device 1 according to the embodiment. The interconnect layer L10 of the circuit board 10 includes a conductive layer 11, a plurality of pad portions PDa, and a plurality of anti-pad portions AP.

The conductive layer 11 is a conductor provided in the interconnect layer L10 of the circuit board 10. The circuit pattern of the interconnect layer L10 including the pad portions PDa and transmission line TL may be formed by processing the conductive layer 11 in an etching process using a mask, upon which the circuit pattern is transferred. For this purpose, the conductive layer 11 and the circuit pattern of the interconnect layer L10 are prepared from the same conductive material. The transmission line TL is formed to be continuous to the pad portion PDa coupled to the transmission line TL.

The pad portions PDa are conductors brought into contact with the solder balls SB or solder portions SP. The pad portions PDa are arranged at predetermined intervals in a grid pattern on the interconnect layer L10 of the circuit board 10. The numerals "1" to "5" indicated along the X direction in FIG. 3 represent the X coordinates of the pad portions PDa. The numerals "1" to "5" indicated along the Y direction in FIG. 3 represent the Y coordinates of the pad portions PDa. In the description below, the symbol "PDa" may be suitably accompanied by "(X coordinate, Y coordinate)" representing the coordinates of the arrangement position of a pad portion PDa. In this example, the transmission line TL is coupled to the pad portion PDa(1, 4).

The anti-pad portions AP of the interconnect layer L10 are regions that separate and insulate the circuit pattern of the interconnect layer L10 from the conductive layer 11. The anti-pad portions AP may be portions of the conductive layer from which a conductor has been removed, or portions of the conductive layer in which an insulator is provided. The interconnect layer L10 includes a plurality of anti-pad portions AP respectively arranged to surround a pad portion PDa, and at least one anti-pad portion AP arranged to surround a pair of a transmission line TL and a pad portion PDa.

[3. Planar Layout of Interconnect Layer L20 of Substrate 22 in Semiconductor Package 20]

FIG. 4 is a plan view showing an exemplary planar layout of an interconnect layer L20 of the substrate 22 in the semiconductor package 20 of the electronic device 1 according to the embodiment. The interconnect layer L20 of the semiconductor package 20 includes a conductive layer 24, a plurality of pad portions PDb, and a plurality of anti-pad portions AP.

The conductive layer 24 is a conductor provided in the interconnect layer L20 of the semiconductor package 20. The circuit pattern of the interconnect layer L20 including the pad portions PDb may be formed by processing the conductive layer 24 in an etching process using a mask, to which the circuit pattern is transferred. For this purpose, the conductive layer 24 and the circuit pattern of the interconnect layer L20 are formed of the same conductive material.

The pad portions PDb are conductors brought into contact with the solder balls SB or solder portions SP. The pad portions PDb are arranged at predetermined intervals in a grid pattern on the interconnect layer L20 of the substrate 22. The numerals "1" to "5" indicated along the X direction in FIG. 4 represent the X coordinates of the pad portions PDb. The numerals "1" to "5" indicated along the Y direction in FIG. 4 represent the Y coordinates of the pad portions PDb. In the description below, the symbol "PDb" may be suitably accompanied by "(X coordinate, Y coordinate)" representing the coordinates of the arrangement position of a pad portion PDb.

The anti-pad portions AP of the interconnect layer L20 are regions that separate and insulate the circuit pattern of the interconnect layer L20 from the conductive layer 24. The interconnect layer L20 includes a plurality of anti-pad portions AP arranged to respectively surround a pad portion PDb.

The pad portions PDb of the substrate 22 in the semiconductor package 20 may be arranged opposite to the respective pad portions PDa of the circuit board 10 in the Z direction. Throughout this specification, a pair of pad portion PDa and pad portion PDb, both of which correspond to the same coordinate, can be regarded as being arranged opposite to each other in the Z direction. In the example, the pad portion PDb(1, 4) is coupled via the solder ball SB to the pad portion PDa(1, 4), which is coupled to the transmission line TL.

[4. Arrangement of Mounted Component MC]

FIG. 5 is a perspective view of an exemplary arrangement of the mounted component MC in the electronic device 1 according to the embodiment. In the electronic device 1, one end of the transmission line TL is coupled to the connector portion CP, and the other end of the transmission line TL is coupled to the pad portion PDa(1, 4) of the circuit board 10. In the electronic device 1, the pad portion PDa(1, 4) of the circuit board 10 is coupled to the pad portion PDb(1, 4) of the semiconductor package 20 via a solder ball SB. In the electronic device 1, one end of the mounted component MC is coupled to the solder ball SB, which is in contact with the pad portion PDb(1, 4), and the other end of the mounted component MC is coupled to the solder portion SP, which is in contact with the pad portion PDb(2, 4).

That is, in the electronic device 1, the connector portion CP is coupled to the IC chip 21 via the transmission line TL, pad portion PDa(1, 4), solder ball SB, and pad portion PDb(2, 4). In the electronic device 1, a mounted component MC is coupled between a solder ball SB and a solder portion SP on the lower surface of the semiconductor package 20 (i.e., the lower surface of the substrate 22). The mounted component MC, when planarly viewed, is arranged in a region overlapping the semiconductor package 20. In other words, in the electronic device 1, the mounted component MC is arranged between the circuit board 10 and the substrate 22 of the semiconductor package 20.

In the electronic device 1, the mounted component MC may be coupled between two pad portions PDb that are adjacent in the X direction, between two pad portions PDb adjacent in the Y direction, or two pad portions PDb adjacent in a direction parallel to the XY plane and intersecting the X direction and Y direction.

[5. Detailed Cross-Sectional Configuration of Electronic Device 1]

FIG. 6 is a cross-sectional view showing a detailed cross-sectional structure of the electronic device 1 according to the embodiment. The cross section in FIG. 6 is taken along the XZ plane of the electronic device 1, and includes pad portions PDb(1, 4), PDb(2, 4) and PDb(3, 4) and a mounted component MC. An insulating layer INS is bold-hatched. In the description below, it is assumed that the circuit board 10 and substrate 22 each include two interconnect layers and two plane layers.

The circuit board 10 further includes plane layers L11 and L12, an interconnect layer L13, insulating layers 100, 110 and 120, a conductive layer 12, and conductive layers PWa and GNDa. On the interconnect layer L13 are the insulating layer 100, plane layer L12, insulating layer 110, plane layer L11, insulating layer 120, and interconnect layer L10 stacked in this order. The insulating layers 110, 120 and 130 may be pre-preg.

The plane layer L11 includes the conductive layer PWa, which is a plate-like conductor that expands along the XY plane. A supply voltage is applied to the conductive layer PWa, for example through a via hole (not shown). A via hole may be formed to penetrate the conductive layer PWa. An anti-pad portion AP (insulating layer INS) may be formed between the conductive layer PWa and the via hole.

The plane layer L12 includes a conductive layer GNDa, which is a plate-like conductor that expands along the XY plane. The conductive layer GNDa is grounded, for example through a via hole (not shown). A via hole may be formed to penetrate the conductive layer GNDa. An anti-pad portion AP (insulating layer INS) may be formed between the conductive layer GNDa and the via hole.

The interconnect layer L13 includes a conductive layer 12, which corresponds to the circuit pattern of the interconnect layer L13. The circuit pattern of the interconnect layer L13 may be electrically connected to the conductor of a different interconnect layer through a via hole (not shown).

The substrate 22 of the semiconductor package 20 includes plane layers L21 and L22, an interconnect layer L23, insulating layers 200, 210 and 220, via holes 25 and 26, and conductive layers PWb and GNDb. On the interconnect layer L20 are the insulating layer 200, plane layer L21, insulating layer 210, plane layer L22, insulating layer 220, and interconnect layer L23 stacked in this order. The insulating layers 210, 220 and 230 may be pre-preg. The via holes 25 and 26 are wirings (conductors) having a portion that extends in the Z direction.

The plane layer L21 includes a conductive layer PWb, which is a plate-like conductor that expands along the XY plane. A supply voltage is applied to the conductive layer PWb, for example through a via hole (not shown). A via hole may be formed to penetrate the conductive layer PWb. An anti-pad portion AP (insulating layer INS) may be formed between the conductive layer PWb and via hole. The conductive layer PWb may be electrically coupled to the via hole.

The plane layer L22 includes a conductive layer GNDb, which is a plate-like conductor that expands along the XY plane. The conductive layer GNDb is grounded through a via hole (not shown). A via hole may be formed to penetrate the conductive layer GNDb. An anti-pad portion AP (insulating layer INS) may be formed between the conductive layer GNDb and via hole. The conductive layer GNDb may be electrically coupled to the via hole.

The interconnect layer L23 includes a plurality of pad portions (not shown) to which bonding wires for coupling the substrate 22 to the IC chip 21 are coupled, a pad portion provided at one end (upper end) of the via hole 25, and a pad portion provided at one end (upper end) of the via hole 26. The other end (lower end) of the via hole 25 corresponds to the pad portion PDb(2, 4), and the other end (lower end) of the via hole 26 corresponds to the pad portion PDb(3, 4). The via holes 25 and 26 are respectively electrically coupled to the IC chip 21.

The pad portion PDb(1, 4) is in contact with a solder ball SB. The pad portion PDb(1, 4) is coupled to the opposing pad portion PDa(1, 4) (i.e., the pad portion PDa coupled to the transmission line TL) via the solder ball SB that is in contact with the pad portion PDb(1,4). The solder ball SB in contact with the pad portion PDb(1, 4) is in contact with the one end of the mounted component MC. The pad portion PDb(1, 4) is not coupled to a conductor of any layer other than the interconnect layer L20. The pad portion PDb(1, 4) is preferably insulated from the circuit pattern of any layer other than the interconnect layer L20.

The pad portion PDb(2, 4) is in contact with a solder portion SP. That is, a solder portion SP is provided at the lower end of the via hole 25. The solder portion SP in contact with the pad portion PDb(2, 4) is in contact with the other end of the mounted component MC. The mounted component MC is fixed by the solder ball SB in contact with the pad portion PDb(1, 4) and the solder portion SP in contact with the pad portion PDb(2, 4). The mounted component MC may be brought into contact with the substrate 22 with an insulator interposed. The solder portion SP in contact with the pad portion PDb(2, 4) is separated from the opposing pad portion PDa(2, 4). In other words, the solder portion SP is not in contact with the circuit board 10, with the semiconductor package 20 mounted on the circuit board 10.

A solder ball SB is in contact with the pad portion PDb(3, 4). That is, a solder ball SB is provided at the lower end of the via hole 26. The pad portion PDb(3, 4) is coupled to the opposing pad portion PDa(3, 4) via the solder ball SB that is in contact with the pad portion PDb(3, 4). The pad portion PDa(3, 4) may be coupled to the circuit pattern formed in the interconnect layer L13, the conductive layer PWa, and the conductive layer GNDa of the circuit board 10 through via holes (not shown).

[1-2] Effects of Embodiment

The semiconductor package 20 mounted on the circuit board 10 of the electronic device 1 according to the embodiment is coupled to the connector portion CP of the circuit board 10 via the transmission line TL and mounted component MC, for which impedance matching has been taken into consideration.

In the electronic device 1 according to the embodiment, the connector portion CP is coupled to the IC chip 21 via the transmission line TL, the solder ball SB provided between the pad portions PDa(1, 4) and PDb(1, 4), the mounted component MC, and the solder portion SP in contact with the pad portion PDb(2, 4). In this manner, in the electronic device 1 according to the embodiment, a signal input to the connector portion CP is conveyed to the IC chip 21 of the semiconductor package 20 through a transmission line TL. That is, in the electronic device 1 according to the embodiment, the regions in which the impedance tends to become discontinuous between the connector portion CP and semiconductor package 20 are concentrated in the joint portion of the connector portion CP and transmission line TL, the joint portion of the pad portion PDa(1, 4) formed to be continuous to the transmission line TL and a solder ball SB, the joint portion of the solder ball SB and mounted component MC, and the joint portion of the mounted component MC and solder portion SP.

Thus, the electronic device 1 according to the embodiment can facilitate the design of a circuit pattern that can resolve the discontinuity in the impedance, or in other words the design of the device for optimizing the signal integrity (SI) properties. The electronic device 1 according to the embodiment can therefore improve the signal quality of the electronic device 1 using the BGA.

In addition, in the electronic device 1 according to the embodiment, the mounted component MC serially coupled to a path of a signal that is input to the connector portion CP is arranged between the solder ball SB and solder portion SP on the lower surface of the substrate 22 of the semiconductor package 20. As a result, the electronic device 1 according to the embodiment can reduce on the circuit board 10 the area of the wiring layout, for which the impedance matching has been considered, and can ease the constraints of the wiring layout.

Furthermore, the circuit board 10 of the electronic device 1 according to the embodiment can improve the SI properties of the electronic device 1, without the need to use a wiring layout having a special design, which would increase the number of operational steps at the time of manufacturing the electronic device 1. As a result, the electronic device 1 according to the embodiment can reduce manufacturing costs of the electronic device 1.

[2] MODIFICATION EXAMPLES

Various modifications may be made for the electronic device 1 according to the embodiment. As the modifications of the electronic device 1 according to the embodiment, the first to sixth modification examples will be introduced below.

[2-1] First Modification Example

FIG. 7 is a cross-sectional view showing an exemplary configuration of an electronic device 1a according to the first modification example. The cross section of FIG. 7 is taken along the XZ plane, where the electronic device 1a includes pad portions PDb(1, 4), PDb(2, 4) and PDb(3, 4), and a mounted component MC. The electronic device 1a according to the first modification example includes a circuit board 10 and a semiconductor package 20a. The semiconductor package 20*a* has a configuration in which the solder portion SP coupled to the other end of the mounted component MC in the electronic device 1 according to the embodiment is replaced with a solder ball SB.

According to the first modification example, one end of the mounted component MC is in contact with the solder ball SB, which is in contact with the pad portion PDb(1, 4), and the other end of the mounted component MC is in contact with the solder ball SB, which is in contact with the pad portion PDb(2, 4). The mounted component MC according to the first modification example is fixed by the solder ball SB in contact with the pad portion PDb(1, 4) and the solder ball SB in contact with the pad portion PDb(2, 4). Furthermore, according to the first modification example, the solder ball SB in contact with the pad portion PDb(2, 4) is brought into contact with the pad portion PDa(2, 4). The rest of the configuration of the electronic device 1*a* according to the first modification example is the same as that of the electronic device 1 according to the embodiment.

In the first modification example, the solder portion SP in contact with the other end of the mounted component MC is replaced with a solder ball SB. The electronic device 1*b* according to the first modification example can achieve effects similar to those of the embodiment.

[2-2] Second Modification Example

FIG. 8 is a cross-sectional view showing an exemplary configuration of an electronic device 1*b* according to the second modification example. The cross section of FIG. 8 is taken along the XZ plane, where the electronic device 1*b* includes pad portions PDb(1, 4), PDb(2, 4) and PDb(3, 4), and mounted components MC1 and MC2. The electronic device 1*b* according to the second modification example includes a circuit board 10*a* and a semiconductor package 20*b*. In the circuit board 10*a*, a solder portion SPa is provided in the pad portion PDa(2, 4). In the semiconductor package 20*b*, a solder portion SPb is provided in the pad portion PDb(2, 4). In the electronic device 1*b*, the mounted component MC1 is coupled between the solder portion SPb and the solder ball SB coupled to the pad portion PDb(1, 4). Amounted component MC2 is coupled between the solder portion SPa and solder portion SPb.

The mounted component MC1 according to the second modification example may be a coupling capacitor. The mounted component MC2 according to the second modification example may be a diode. The pad portion PDa(2, 4) coupled to the mounted component MC2 is electrically coupled to the conductive layer GNDa via a via hole. The anode and cathode of the diode are respectively coupled to either one of the solder portions SPa and SPb in accordance with the type of the diode. For instance, if the mounted component MC2 is a PN junction diode, the anode of the diode is coupled to the solder portion SPb, and the cathode of the diode is coupled to the solder portion SPa.

According to the second modification example, an electronic component such as a diode is mounted between the circuit board 10 and semiconductor package 20. The electronic device 1*b* according to the second modification example can achieve effects similar to those of the embodiment.

Furthermore, with a diode coupled between the pad portion PDa(2, 4) and pad portion PDb(2, 4), the electronic device 1*b* according to the second modification example can improve the electrostatic discharge (ESD) withstand voltage and CDM withstand voltage.

[2-3] Third Modification Example

FIG. 9 is a cross-sectional view showing an exemplary configuration of an electronic device 1*c* according to the third modification example. The cross section of FIG. 9 is taken along the XZ plane, where the electronic device 1*c* includes pad portions PDb(1, 4), PDb(2, 4) and PDb(3, 4), and a mounted component MC. The electronic device 1*c* according to the third modification example includes a circuit board 10*b* and a semiconductor package 20*c*. In the circuit board 10*b*, the plane layer L11 includes an anti-pad portion APa. In the semiconductor package 20*c*, the plane layer L21 includes an anti-pad portion APb.

The anti-pad portion APa is provided in a portion of the plane layer L11 opposing in the Z direction the pad portion PDa(1, 4) in contact with the solder ball SB to which the transmission line TL is coupled. The planar shape of the anti-pad portion APa may be the same as, or different from, that of the pad portion PDa(1, 4). This planar shape of the anti-pad portion APa can be suitably designed so that the impedance can be matched at the contact point of the solder ball SB between the pad portions PDa(1, 4) and PDb(1, 4).

The anti-pad portion APb is provided in a portion of the plane layer L21 opposing in the Z direction the pad portion PDb(1, 4) in contact with the solder ball SB to which the transmission line TL is coupled. The planar shape of the anti-pad portion APb may be the same as, or different from, that of the pad portion PDb(1, 4). This planar shape of the anti-pad portion APb can be suitably designed such that the impedance can be matched at the contact point of the solder ball SB between the pad portions PDa(1, 4) and PDb(1, 4).

According to the third modification example, anti-pad portions APa and APb are provided in the plane layers L11 and L21, respectively. The electronic device 1*c* according to the third modification example can achieve effects similar to those of the embodiment.

Furthermore, with the anti-pad portions APa and APb provided respectively in the plane layers L11 and L21, the electronic device 1*c* according to the third modification example can reduce the parasitic capacitance at the contact point of the solder ball SB between the pad portions PDa(1, 4) and PDb(1, 4). Thus, the electronic device 1*c* according to the third modification example can reduce the impedance discontinuity in accordance with the layout of the anti-pad portions APa and APb, which can improvee the signal quality of the electronic device 1*c*. According to the third modification example, at least one of the anti-pad portions APa and APb may be provided.

[2-4] Fourth Modification Example

Figure 10:
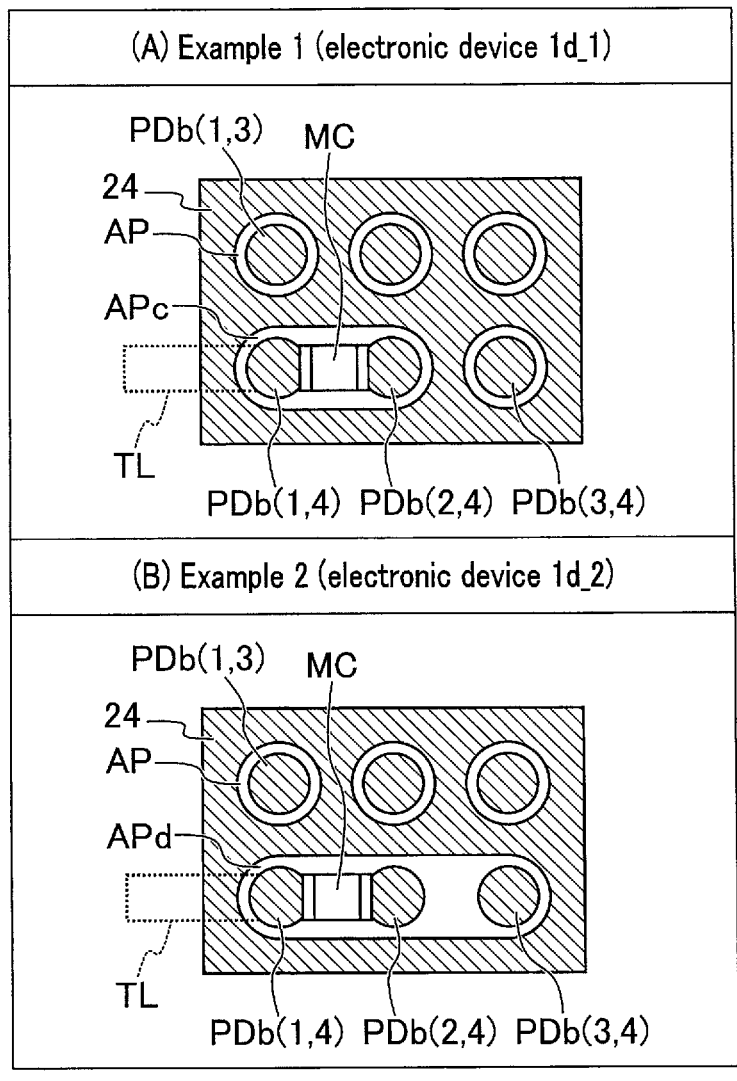
FIG. 10 is a diagram showing exemplary configurations of electronic devices according to the fourth modification example.

FIG. 10 is a diagram showing an exemplary configuration of the electronic device 1*d* according to the fourth modification example. (A) and (B) in FIG. 10 indicate an electronic device 1*d*_1 according to 1st Example of the fourth modification example, and an electronic device 1*d*_2 according to 2nd Example of the fourth modification example. Each of (A) and (B) in FIG. 10 shows a planar layout of anti-pad portions AP in the regions including pad portions PDb, to which the transmission line TL is electrically coupled, in the interconnect layer L10 of the substrate 22.

As illustrated in (A) of FIG. 10, an anti-pad portion APc is provided in the electronic device 1*d*_1 according to 1st Example of the fourth modification example to collectively surround the pad portions PDb(1, 4) and PDb(2, 4), to each of which a mounted component MC is coupled. The remaining pad portion PDb is surround by an anti-pad portion AP in the same manner as in the embodiment. The rest of the configuration of the electronic device 1*d*_1 in the electronic device 1 is the same as that of the embodiment.

As illustrated in (B) of FIG. 10, an anti-pad portion APd is provided in the electronic device 1*d*_2 according to 2nd Example of the fourth modification example to surround the circumference of the pad portions PDb(1, 4) and PDb(2, 4) to each of which a mounted component MC is coupled, together with the circumference of the pad portion PDb(3, 4) adjacent to the pad portion PDb(2, 4). In other words, the anti-pad portion APd is provided so as to collectively surround the circumference of the pad portions PDb(l, 4) and PDb(2, 4) coupled to the mounted component MC and the circumference of the pad portion PDb adjacent to the pad portion PDb(1, 4) or PDb(2, 4). The rest of the configuration of the electronic device 1*d*_2 is the same as that of the electronic device 1 of the embodiment.

According to the fourth modification example, anti-pad portions APc and APd are provided in the interconnect layer L20. The electronic device 1*c* according to the fourth modification example can achieve effects similar to those of the embodiment.

Furthermore, the electronic device 1*d* according to the fourth modification example can regulate the reduction in the parasitic capacitance at the contact point of the solder ball SB between the pad portions PDa(1, 4) and PDb(1, 4), using the layout of the anti-pad portions APc and APd. In this manner, the electronic device 1*d* according to the fourth modification example can reduce the discontinuity in the impedance, enhancing the signal quality of the electronic device 1*d*. The anti-pad portions APc and APd may also be provided in the interconnect layer L10 so that the parasitic capacitance at the contact point of the solder ball SB can be further adjusted in accordance with the layout of the anti-pad portions AP in the interconnect layer L10.

[2-5] Fifth Modification Example FIG. 11 is a block diagram showing an exemplary configuration of an electronic device 1*e* according to the fifth modification example. The electronic device 1*e* includes a circuit board 10*c* and a semiconductor package 20*e*. The circuit board 10*c* includes connector portions CP1 and CP2 and transmission lines TL1 and TL2. The semiconductor package 20*e* includes an IC chip 21*a*, solder balls SB1 and SB2, solder portions SP1 and SP2, and mounted components MCa and MCb. The transmission lines TL1 and TL2 are differential signal wirings.

In the electronic device 1*e*, the connector portion CP1 is coupled to the IC chip 21*a* via the transmission line TL1, the solder ball SB1, the mounted component MCa, and the solder portion SP1. In the same manner as in the embodiment, one end of the mounted component MCa is coupled to the solder ball SB1, and the other end of the mounted component MCa is coupled to the solder portion SP1. In the electronic device 1*e*, the connector portion CP2 is coupled to the IC chip 21*a* via the transmission line TL2, the solder ball SB2, the mounted component MCb, and the solder portion SP2. In the same manner as in the embodiment, one end of the mounted component MCb is coupled to the solder ball SB2, and the other end of the mounted component MCb is coupled to the solder portion SP2. The rest of the configuration of the electronic device 1*e* according to the fifth modification example is the same as that of the embodiment.

The configuration explained in the embodiment is applied to the differential signal wirings of the fifth modification example. The electronic device 1*e* according to the fifth modification example can achieve effects similar to those of the embodiment.

[2-6] Sixth Modification Example

FIG. 12 is a diagram presenting exemplary configurations of electronic devices 1*f* according to the sixth modification example. (A), (B), (C), (D), (E) and (F) of FIG. 12 respectively correspond to the electronic device 1*f*_1 according to 1st Example of the sixth modification example, the electronic device 1*f*_2 according to 2nd Example of the sixth modification example, the electronic device 1*f*_3 according to 3rd Example of the sixth modification example, the electronic device 1*f*_4 according to 4th Example of the sixth modification example, the electronic device 1*f*_5 according to 5th Example of the sixth modification example, and the electronic device 1*f*_6 according to 6th Example of the sixth modification example. Each of (A), (B), (C), (D), (E) and (F) of FIG. 13 shows a planar layout of an anti-pad portion AP in the interconnect layer L10 of the substrate 22, in the regions to which the transmission lines TL1 and TL2 are electrically coupled and which include two adjacent pad portions PDb.

As illustrated in (A) of FIG. 12, an anti-pad portion AP is provided for each of the pad portions PDb in the electronic device 1*f*_1 according to 1st Example of the sixth modification example to surround the circumference of the corresponding pad portion PDb.

As illustrated in (B) of FIG. 12, an anti-pad portion APc is provided in the electronic device 1*f*_2 according to 2nd. Example of the sixth modification example to collectively surround the circumference of the pad portions PDb(1, 4) and PDb(2, 4), which are respectively coupled to one end and the other end of the mounted component MCa. In a similar manner, an anti-pad portion APc is provided in the electronic device 1*f*_2 to collectively surround the circumference of the pad portions PDb(1, 5) and PDb(2, 5), which are respectively coupled to one end and the other end of the mounted component MCb. The rest of the configuration of the electronic device 1*f*_2 is the same as that of the electronic device 1 of the embodiment.

As illustrated in (C) of FIG. 12, an anti-pad portion APd is provided in the electronic device 1*f*_3 according to 3rd Example of the sixth modification example to surround the circumference of the pad portions PDb(1, 4) and PDb(2, 4) which are respectively coupled to one end and the other end of the mounted component MCa, together with the circumference of the pad portion PDb(3, 4) adjacent to the pad portion PDb(2, 4). In a similar manner, an anti-pad portion APd is provided in the electronic device 1*f*_3 to surround the circumference of the pad portions PDb(1, 5) and PDb(2, 5) which are respectively coupled to one end and the other end of the mounted component MCb, together with the circumference of the pad portion PDb(3, 5) adjacent to the pad portion PDb(2, 5). The rest of the configuration of the electronic device 1*f*_3 is the same as that of the electronic device 1 of the embodiment.

As illustrated in (D) of FIG. 12, an anti-pad portion APe is provided in the electronic device 1*f*_4 according to 4th Example of the sixth modification example to collectively surround the circumference of the pad portion PDb(1, 4) which is coupled to one end of the mounted component MCa and the circumference of the pad portion PDb(1, 5) which is coupled to one end of the mounted component MCb. In a similar manner, an anti-pad portion APe is provided in the electronic device 1*f*_4 to collectively surround the circumference of the pad portion PDb(2, 4) which is coupled to one end of the mounted component MCa and the circumference of the pad portion PDb(2, 5) which is coupled to one end of the mounted component MCb. The rest of the configuration of the electronic device 1*f*_4 is the same as that of the electronic device 1 of the embodiment.

As illustrated in (E) of FIG. 12, in the electronic device 1*f*_5 according to 5th Example of the sixth modification example, an anti-pad portion APf is provided to collectively surround the circumference of the pad portions PDb(1, 4) and PDb(2, 4) which are respectively coupled to one end and the other end of the mounted component MCa and the circumference of the pad portions PDb(1, 5) and PDb(2, 5) which are respectively coupled to one end and the other end of the mounted component MCb. The rest of the configuration of the electronic device 1f_5 is the same as that of the electronic device 1 of the embodiment.

As illustrated in (F) of FIG. 12, an anti-pad portion APg is provided in the electronic device 1f_6 according to 6th Example of the sixth modification example to collectively surround the circumference of the pad portions PDb(1, 4) and PDb(2, 4) which are respectively coupled to one end and the other end of the mounted component MCa, the circumference of the pad portion PDb(3, 4) adjacent to the pad portion PDb(2, 4), the circumference of the pad portions PDb(1, 5) and PDb(2, 5) which are respectively coupled to one end and the other end of the mounted component MCb, and the circumference of the pad portion PDb(3, 5) adjacent to the pad portion PDb(2, 5). In other words, the anti-pad portion APg is provided such that the circumferences of the pad portions PDb(1, 4) and PDb(2, 4) coupled to the mounted component MCa, the pad portion PDb adjacent to the pad portion PDb(1, 4) or PDb(2, 4), the pad portions PDb(1, 5) and PDb(2, 5) coupled to the mounted component MCb, the pad portion PDb adjacent to the pad portions PDb(1, 5) or PDb(2, 5), are collectively surrounded. The rest of the configuration of the electronic device 1f_6 is the same as that of the electronic device 1 of the embodiment.

According to the sixth modification example, the shape of an anti-pad portion AP can be variously modified. The interconnect layer L20 includes at least one of the anti-pad portions APc, APd, APe, APf, and APg. The electronic device 1f according to the sixth modification example can achieve effects similar to those of the embodiment.

Furthermore, the electronic device 1f according to the sixth modification example can regulate the reduction in the parasitic capacitance at the contact point of the solder ball SB between the pad portions PDa(1, 4) and PDb(1, 4), using the layout of the anti-pad portions APc, APd, APe, APf, and APg. In this manner, the electronic device 1f according to the sixth modification example can reduce the discontinuity in the impedance, enhancing the signal quality of the electronic device 1f. The anti-pad portions APc, APd, APe, APf, and APg may also be provided in the interconnect layer L10 so that the parasitic capacitance at the contact point of the solder ball SB can be further adjusted in accordance with the layout of the anti-pad portions AP in the interconnect layer L10.

[3] OTHERS

The coordinates of the pad portions PD indicated above are introduced merely as examples. In the embodiment, the pad portion PDa(1, 4) is coupled to the transmission line TL, which is not a limitation. The pad portion PDa coupled to the transmission line TL can be suitably modified in accordance with the design of the circuit board 10. The number and arrangement of solder balls SB for coupling the semiconductor package 20 to the circuit board 10 can be freely designed. In the electronic device 1, solder portions SP may be provided between respective solder balls SB and respective pad portions PDb. A plurality of solder balls SB may be formed underneath the substrate 22 of the semiconductor package 20 after the ends of the mounted components MC are fixed by the solder portions SP.

The embodiment is discussed merely as an example, which does not limit the scope of invention.

[4] COMPARATIVE EXAMPLE

Next, an electronic device 2 according to a comparative example will be described. FIG. 13 is a perspective view showing an exemplary arrangement of amounted component in the electronic device 2 according to the comparative example. The electronic device 2 according to the comparative example includes a circuit board 10d and a semiconductor package 20f. The electronic device 2 according to the comparative example further includes transmission lines TLa and TLb.

In the electronic device 2, one end of the transmission line TLa is coupled to the connector portion CP, and the other end of the transmission line TLa is coupled to the mounted component MC. In the electronic device 2, the other end of the mounted component MC is coupled to one end of the transmission line TLb, and the other end of the transmission line TLb is coupled to the pad portion PDa of the circuit board 10d. In the electronic device 2, the pad portion PDa of the circuit board 10d is coupled to the pad portion PDb of the semiconductor package 20f via a solder ball SB. The mounted component MC of the electronic device 2 is arranged in the area that does not overlap the semiconductor package 20f when planarly viewed.

In the electronic device 2 according to the comparative example, the connector portion CP is coupled to the IC chip 21 via the transmission line TLa, mounted component MC, transmission line TLb, pad portion PDa, solder ball SB, and pad portion PDb. That is, in the electronic device 2 according to the comparative example, a signal input to the connector portion CP is conveyed to the IC chip 21 of the semiconductor package 20f through at least two transmission lines TLa and TLb.

As a result, in the electronic device 2 according to the comparative example, impedance discontinuity tends to occur at the joint portion of the connector portion CP and transmission line TLa, the joint portion of the transmission line TLa and mounted component MC, the joint portion of the mounted component MC and transmission line TLb, and the joint portion of the transmission line TLb (pad portion PDa) and solder ball SB. In addition, limitations may be placed on the layout of the circuit pattern of the circuit board 10d in order to match the impedances in the electronic device 2 according to the comparative example.

The invention claimed is:
1. An electronic device comprising:
a first substrate including a first connector portion, a plurality of first pad portions, and a first transmission line, the first pad portions being arranged at intervals in a grid pattern on an upper surface of the first substrate, the first pad portions including a second pad portion, the first transmission line coupling the second pad portion and the first connector portion to each other;
a second substrate including a plurality of third pad portions, the third pad portions being arranged on a lower surface of the second substrate to respectively oppose the first pad portions in a first direction, the third pad portions including a fourth pad portion and a fifth pad portion;
a first conductor coupled to the fourth pad portion and to the second pad portion;
a second conductor coupled to the fifth pad portion; and a first electronic component having one end coupled to the first conductor and other end coupled to the second conductor.

2. The electronic device of claim 1, wherein
the fourth pad portion and the fifth pad portion are adjacent to each other.

3. The electronic device of claim 1, wherein
the first conductor is separated and insulated from a conductor arranged in a layer above the first conductor.

4. The electronic device of claim 1, wherein
no electronic component is coupled between the first connector portion and the second pad portion.

5. The electronic device of claim 1, wherein
the first conductor is a solder ball, and
the second conductor is a solder paste.

6. The electronic device of claim 1, wherein
the first pad portions include a sixth pad portion arranged opposite to the fifth pad portion in the first direction,
the second conductor is coupled to the sixth pad portion, and
each of the first conductor and the second conductor is a solder ball.

7. The electronic device of claim 1, wherein
the first electronic component is a coupling capacitor.

8. The electronic device of claim 7, further comprising:
a second electronic component, wherein
the first pad portions include a sixth pad portion arranged opposite to the fifth pad portion in the first direction,
the second electronic component is coupled between the second conductor and the sixth pad portion, and
the second electronic component is a diode.

9. The electronic device of claim 1, wherein
the first substrate includes a first layer and a second layer, the first layer including the first pad portions and the second layer being adjacent to the first layer with an insulating layer interposed,
the second substrate includes a third layer and a fourth layer, the third layer including the third pad portions and the fourth layer being adjacent to the first layer with an insulating layer interposed, and
an anti-pad portion is provided in at least one of a portion of the second layer of the first substrate that opposes the second pad portion in the first direction and a portion of the fourth layer of the second substrate that opposes the fourth pad portion in the first direction.

10. The electronic device of claim 1, wherein
the second substrate further includes a plurality of anti-pad portions that respectively surround the third pad portions.

11. The electronic device of claim 1, wherein
the second substrate further includes an anti-pad portion that surrounds the fourth pad portion and the fifth pad portion.

12. The electronic device of claim 1, wherein
the third pad portions include a seventh pad portion adjacent to the fourth pad portion or the fifth pad portion, and
the second substrate further includes an anti-pad portion that surrounds the fourth pad portion, the fifth pad portion, and the seventh pad portion.

13. The electronic device of claim 1, further comprising:
a third conductor;
a fourth conductor; and
a third electronic component, wherein the first pad portions include an eighth pad portion adjacent to the second pad portion in the second direction,
the third pad portions include a ninth pad portion and a tenth pad portion adjacent to each other in a third direction,
the first substrate further includes a second connector portion and a second transmission line, the second transmission line coupling the eighth pad portion and the second connector portion to each other,
the third conductor is coupled to the ninth pad portion and to the eighth pad portion,
the fourth conductor is coupled to the tenth pad portion, and
one end of the third electronic component is coupled to the third conductor, and other end of the third electronic component is coupled to the fourth conductor.

14. The electronic device of claim 13, wherein
no electronic component is coupled between the first connector portion and the second pad portion, and no electronic component coupled between the second connector portion and the eighth pad portion.

15. The electronic device of claim 13, wherein
the second substrate further includes a plurality of anti-pad portions that surround the respective third pad portions.

16. The electronic device of claim 13, wherein
the second substrate further includes a first anti-pad portion and a second anti-pad portion that differs from the first anti-pad portion, the first anti-pad portion surrounding the fourth pad portion and the fifth pad portion, and the second anti-pad portion surrounding the ninth pad portion and the tenth pad portion.

17. The electronic device of claim 13, wherein
the third pad portions include a seventh pad portion adjacent to the fourth pad portion or the fifth pad portion, and an eleventh pad portion adjacent to the ninth pad portion or the tenth pad portion,
the second substrate further includes a first anti-pad portion and a second anti-pad portion, the first anti-pad portion surrounding the fourth pad portion, the fifth pad portion, and the seventh pad portion, and the second anti-pad portion surrounding the ninth pad portion, the tenth pad portion, and the eleventh pad portion.

18. The electronic device of claim 13, wherein
the second substrate further includes a first anti-pad portion and a second anti-pad portion that differs from the first anti-pad portion, the first anti-pad portion surrounding the fourth pad portion and the ninth pad portion, and the second anti-pad portion surrounding the fifth pad portion and the tenth pad portion.

19. The electronic device of claim 13, wherein
the second substrate further includes an anti-pad portion that surrounds the fourth pad portion, the fifth pad portion, the ninth pad portion, and the tenth pad portion.

20. The electronic device of claim 13, wherein
the third pad portions include a seventh pad portion adjacent to the fourth pad portion or the fifth pad portion and an eleventh pad portion adjacent to the ninth pad portion or the tenth pad portion, and
the second substrate further includes an anti-pad portion that surrounds the fourth pad portion, the fifth pad portion, the seventh pad portion, the ninth pad portion, the tenth pad portion, and the eleventh pad portion.

\* \* \* \* \*